(12) United States Patent
Case et al.

(10) Patent No.: US 6,826,987 B1
(45) Date of Patent: *Dec. 7, 2004

(54) METHOD FOR CUTTING MOVABLE WEB MATERIAL

(75) Inventors: James Ralph Case, Brackney, PA (US); Michael James Cummings, Vestal, NY (US); John Michael Griffin, Friendsville, PA (US); Michael Vito Longo, Glen Aubrey, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 889 days.

(21) Appl. No.: 09/042,897

(22) Filed: Mar. 16, 1998

Related U.S. Application Data

(62) Division of application No. 08/696,673, filed on Aug. 14, 1996, now abandoned.

(51) Int. Cl.⁷ .............................. B26D 1/11; B26D 7/02; H05K 3/02
(52) U.S. Cl. ................... 83/56; 83/22; 83/100; 83/356.3; 83/451; 83/578; 83/614; 83/698.21; 156/250
(58) Field of Search .................. 83/614, 578, 658, 83/451, 698.21, 13, 22, 56, 284, 318, 319, 353, 356.3, 100; 156/250, 522, 510

(56) References Cited

U.S. PATENT DOCUMENTS

| | | | |
|---|---|---|---|
| 3,079,827 A | * 3/1963 | Castelli | 83/614 X |
| 3,595,564 A | 7/1971 | De Young | 271/46 |
| 3,641,854 A | * 2/1972 | Keesling | 83/614 X |
| 3,680,418 A | 8/1972 | Phillips | 83/80 |
| 3,703,116 A | 11/1972 | Doll | 83/17 |
| 3,728,921 A | 4/1973 | Vogel | 83/151 |
| 3,748,939 A | 7/1973 | Feinstein et al. | 83/370 |
| 3,888,066 A | 6/1975 | Tabur | 53/167 |
| 3,965,785 A | 6/1976 | Johns | 83/316 |
| 4,207,667 A | 6/1980 | D'Angelo et al. | 29/417 |
| 4,743,325 A | * 5/1988 | Miyake | 156/250 |
| 4,772,353 A | 9/1988 | Weiss et al. | 156/521 |
| 4,785,698 A | * 11/1988 | Stork | 83/318 X |
| 4,919,351 A | 4/1990 | McNeil | 242/56 R |
| 5,053,099 A | * 10/1991 | Seki et al. | 156/250 |
| 5,074,178 A | 12/1991 | Shetley et al. | 83/47 |
| 5,103,703 A | 4/1992 | Littleton | 83/155 |
| 5,120,386 A | * 6/1992 | Seki et al. | 83/578 X |
| 5,148,729 A | * 9/1992 | Krumdieck | 83/698.21 X |
| 5,162,071 A | 11/1992 | Nagafuchi et al. | 156/517 |
| 5,176,784 A | 1/1993 | Nagafuchi et al. | 156/510 |
| 5,188,699 A | 2/1993 | Senda | 156/521 |
| 5,372,670 A | 12/1994 | Cummings et al. | 156/390 |
| 5,425,834 A | 6/1995 | Shinohara et al. | 156/360 |
| 5,442,983 A | * 8/1995 | D'Angelo et al. | 83/614 X |
| 5,456,789 A | 10/1995 | Boucher | 156/354 |
| 5,595,101 A | * 1/1997 | Yoshimatsu et al. | 83/614 X |
| 5,768,968 A | * 6/1998 | Park et al. | 83/614 |

* cited by examiner

*Primary Examiner*—Charles Goodman
(74) *Attorney, Agent, or Firm*—Connolly Bove Lodge & Hutz LLP; Larry J. Hume

(57) ABSTRACT

A cutting apparatus and method wherein a blade holder includes two blades which are each designed for cutting web material (e.g., dry film photoresist) in a reverse manner prior to application of the material to a substrate (e.g., dielectric-conductor structure) designed for eventual usage as a printed circuit board or as part thereof (e.g., if laminated up with other, similarly formed substrate members).

3 Claims, 3 Drawing Sheets

METHOD FOR CUTTING MOVABLE WEB MATERIAL

This Application is a divisional application of Ser. No. 08/696,673, filed Aug. 14, 1996 now abandoned.

TECHNICAL FIELD

The invention relates to apparatus and methods for cutting web materials and particularly to such materials which are movable through the apparatus prior to and subsequent such cutting. Even more particularly, the invention relates to cutting web materials that will eventually form part of a circuitzed substrate such as a printed circuit board. One particular example of such material is what is referred to in the industry as dry film photoresist.

BACKGROUND OF THE INVENTION

As is known, the manufacture of circuitized substrates such as those referred to in the industry as printed circuit (or wiring) boards typically involves the precisioned alignment of individual sheets of web material known as photoresist film. Such material when cut into individual sheet form, is then typically bonded to a base substrate which includes a dielectric material (e.g., a fiberglass-reinforced epoxy resin material commonly referred to in the industry as "FR4" material) having a layer of electrically conductive material (e.g., thin copper) bonded thereto. These members are then laminated together to form a core structure or the like which is then subjected to photolithographic processing to form the desired circuitry on the conductive layer. This resulting structure may then be populated with desired electronic devices (e.g., semiconductor chips, capacitors, resistors, etc.) to form a printed circuit (or wiring) board. Alternatively, this resulting structure may then be aligned, with other, similar structure and laminated to form a multilayered structure when then may be populated, etc. during subsequent processing.

Photoresists are categorized as negative or positive and may be obtained in solid (dry film) or liquid form for application onto the aforementioned dielectric-conductor subassembly. The use of liquid (also called "wet") photoresist processing presents several problems to the manufacturer, including the need for complex controlling of liquid material flow, along with relatively complex mechanisms (e.g., rollers) for handling same. The use of dry photoresist films eliminates many of these difficulties and such films are thus more desirable from a manufacturing standpoint. It will be understood from the following that the invention is particularly directed to use of dry film photoresist materials, including those applied to an underlying dielectric-onductive layer subassembly using adhesive or the like. It is to be understood, however, that the invention is not limited to such materials, as it is readily possible to utilize the unique teachings of this invention with several other different varieties of "dry" materials (including, e.g., paper, photographic film, etc.).

There are several known methods and apparatus for handling web material including photoresist films, as described and illustrated in the following U.S. Letters Patents:

U.S. Pat. No. 3,595,564—De Young
U.S. Pat. No. 3,680,418—Phillips
U.S. Pat. No. 3,703,116—Doll
U.S. Pat. No. 3,728,921—Vogel
U.S. Pat. No. 3,748,939—Feinstein et al
U.S. Pat. No. 3,888,066—Tabur
U.S. Pat. No. 3,965,785—Johns
U.S. Pat. No. 4,207,667—D'Angelo et al
U.S. Pat. No. 4,772,353—Weiss et al
U.S. Pat. No. 4,919,351—McNeil
U.S. Pat. No. 5,074,178—Shetley et al
U.S. Pat. No. 5,103,703—Littleton
U.S. Pat. No. 5,162,071—Nagafuchi et al
U.S. Pat. No. 5,176,784—Nagafuchi et al
U.S. Pat. No. 5,188,699—Senda
U.S. Pat. No. 5,372,670—Cummings et al
U.S. Pat. No. 5,425,834—Shinohara et al
U.S. Pat. No. 5,456,789—Boucher Of these, particular attention is directed to U.S. Pat. No. 4,772,353 which specifically describes cutting photoresist webs using cutters (10) which engage the webs prior to board positioning. Attention is also directed to U.S. Pat. Nos. 5,425,834 and 5,456,789 where web materials are roller supplied and cut using various blade structures. Finally, attention is directed to U.S. Pat. No. 5,372,670, which is assigned to the same assignee as the present invention and is incorporated herein by reference. U.S. Pat. No. 5,372,670 defines a system for application of dry film photoresist material which in turn has been supplied from two spaced apart rollers such that the dry film will be positioned on opposite sides of the interim substrate. It is to be understood that the present invention could be utilized with this and similar structures.

A particular method of cutting dry film photoresist material involves the use of rotating, round (pizza-cutter type) cutters which cut the web material at two locations to define the sheet desired for a particular end product (circuit board). Such cutters are considered relatively expensive and maintenance-intensive, often requiring replacement. Such cutters have also proven to have a deleterious effect on the motors used to drive same, often causing motor burn out, thus adding even further to the cost of such assemblies.

It is believed that a cutting apparatus for web material such as dry film photoresist which overcomes the aforementioned disadvantages as well as those found in one or more of the foregoing several patents would represent a significant advancement in the art.

OBJECTS AND SUMMARY OF THE INVENTION

It is, therefore, a primary object of the present invention to provide a new and unique apparatus and method for cutting web material which obviates the various disadvantages cited herein and otherwise discernible from reviewing the foregoing patents.

It is another object of the invention to provide a method and apparatus for cutting dry film material such as photoresist which is then almost immediately deposited on an underlying substrate such as described above.

It is still another object of the invention to provide such a method and apparatus which can be produced and operated in a relatively inexpensive manner (e.g., by assuring ready repair and replacement of various parts thereof if needed).

In accordance with one embodiment of the invention, there is provided an apparatus for cutting web material which comprises a blade holder adapted for being reciprocally moved in a second direction substantially perpendicular to the first direction of movement of the web material, and first and second blades angularly positioned on the blade holder relative to one another and to the second direction of reciprocal movement of the blade holder, each of the blades adapted for engaging the web material in a reverse manner at a predetermined angle during at least part of the reciprocal movement.

In accordance with another embodiment of the invention, there is provided a method for cutting web material wherein the method comprises the steps of cutting the web material at a first location by engaging the web material with a first blade in a reverse manner wherein the blade moves in a second direction substantially perpendicular to the first direction of movement of the web material, and thereafter cuing the web material at a second location spaced from the first location by engaging the web material with a second blade also in a reverse manner wherein the second blade moves in a third direction also substantially perpendicular to the first direction and substantially opposite the second direction.

In accordance with still another embodiment of the invention, there is provided a method for making a printed circuit board wherein the method comprises the steps of providing a substrate including a dielectric having a conductive layer thereon, providing a length of web material, cutting the web material at a first location by engaging the web material with a first blade in a reverse manner wherein the blade moves in a second direction substantially perpendicular to the first direction of movement of the web material, thereafter cutting the web material at a second location spaced from the first location by engaging the web material with a second blade also in a reverse manner wherein the second blade moves in a third direction also substantially perpendicular to the first direction and substantially opposite the second direction. The cutting results in a predetermined length of said web material which is then positioned on the substrate. An electrical circuit is then formed from the conductive layer.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
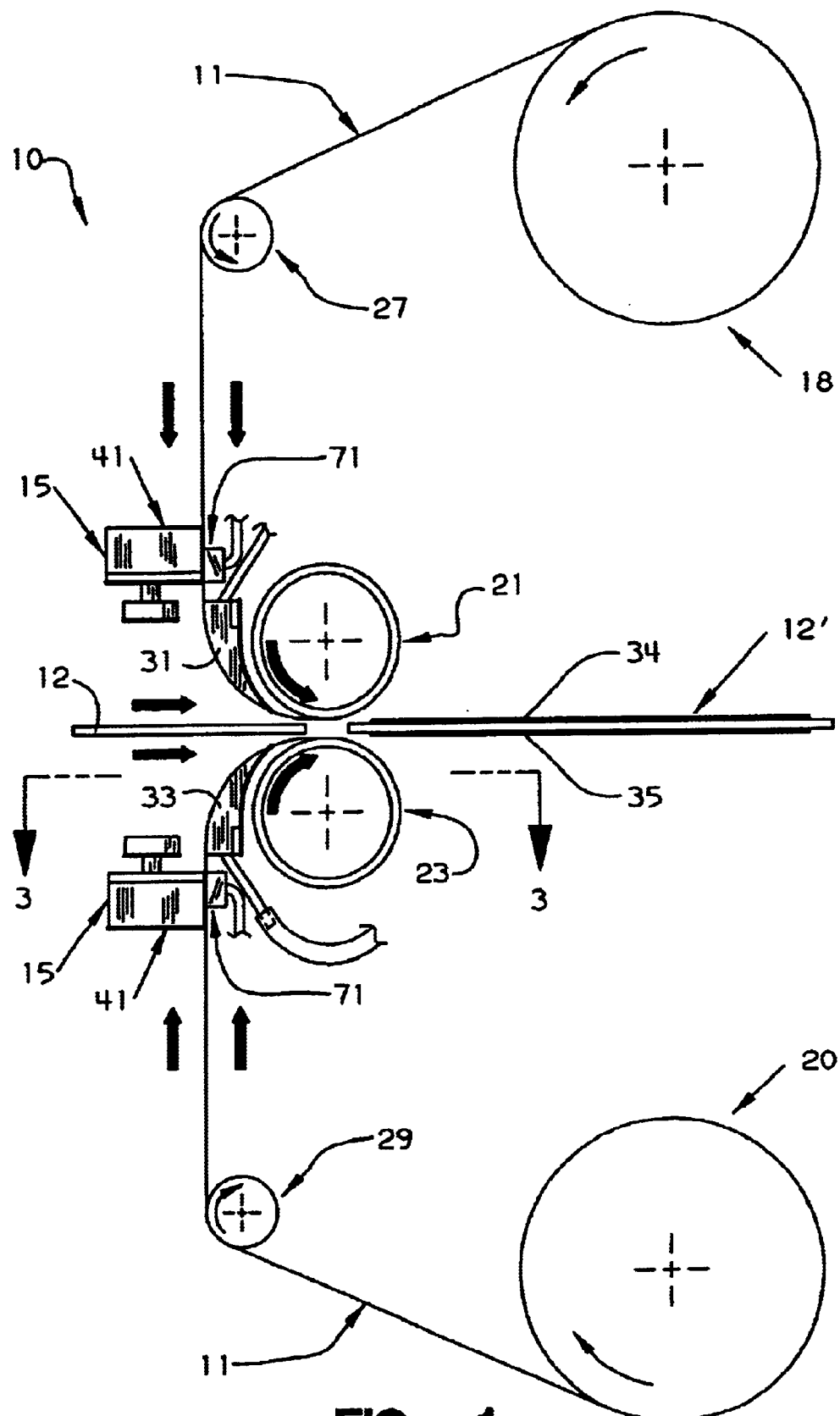
FIG. 1 is a side elevational view of an assembly for producing printed circuit board substrates which utilizes one or more (two shown in FIG. 1) of the cutting apparatus of the invention.

In FIG. 1, there is shown a system 10 for applying dry film material 11 such as photoresist to a panel 12. System 10 is particularly adapted for utilizing the cutting apparatus (15) of the present invention. System 10 may include some of the elements of the system defined in U.S. Pat. No. 5,372,670, which, as stated, is incorporated herein by reference. Specifically, system 10 in FIG. 1 includes upper and lower supply rolls 18 and 20 for supplying the photoresist in dry film manner to the respective opposite sides of interim panel 12. In one embodiment, panel 12 is preferably comprised of a known printed circuit board dielectric material, e.g., fiberglass-reinforced epoxy resin, having thereon conductive layers, e.g., copper, on opposite sides thereof. As seen in FIG. 1, this thin film material is eventually aligned with the interim panel 12 and bonded thereto, e.g., using compression rollers 21 and 23 (shown in phantom). Prior to such application, it is possible to apply an adhesive to the surfaces of panel 12 and/or each of the two dry film sheets being bonded to the panel. Significantly, it is possible to utilize the wet application elements of the system in U.S. Pat. No. 5,372,670 (e.g., to apply a wetting agent such as water to the opposite surfaces of the panel prior to roller engagement and compression). Supply rollers 18 and 20, as well as directional rollers 27 and 29, are rotatably mounted on a frame (not shown) for necessary rotation during supply of the dry film material. In addition to the aforementioned rollers, guide structures 31 and 33 are preferably utilized to guide the respective dry film layers onto the respective opposite surfaces of panel 12. It is also possible in the present invention to apply heat to the film material at this stage to thereby enhance the subsequent compression (lamination) step. It is also possible to heat the respective compression rollers 21 and 23 for this purpose. Panel 12 may be moved by additional rollers in the direction shown, prior to and following lamination.

As seen in FIG. 1, system 10 includes a cutting apparatus 15 for each of the two dry film materials that are being bonded to panel 12. Each of the cutting apparatus as defined herein is utilized to uniquely sever respective sheets of dry film material from the respective supply rolls to a length which is designed to match that of the interim panel 12. In FIG. 1, a panel 12' having respective opposite dry film sheets 34 and 35 laminated thereon, is shown exiting system 10 following the aforementioned compression step. It is thus understood that the purpose of the cutting apparatus of the present invention is to selectively cut each of the incoming dry film materials at two spaced locations to define the required length for each of the sheets being laminated per panel. As will be defined by the following, it has been determined that the best means for providing such dual cutting for each sheet is to utilize a reciprocal form of cut wherein the cutting mechanism moves in a reverse manner (substantially perpendicular to the direction of movement of the film material being cut).

In one embodiment of the invention, a rectangular panel 12 having side and length dimensions of 19.5 and 24 inches, respectively, was covered with dry film photoresist material wherein each of the opposite sheets thereof were cut to a length of about 19 inches. It is understood that the invention is not limited to such dimensional constraints, as it is readily possible to provide both larger and smaller sized sheets, depending on the respective dimensions of the receiving panel.

In a preferred embodiment of the invention, the dry film photoresist material was 1.5 mil fully aqueous photoresist available from MacDermid, Inc. of Delaware under the product name CFI.

As will be defined, each of the cutting apparatus 15 for the system in FIG. 1 is positioned in a predetermined orientation relative to the direction of film material passage. Specifically, and as will be further described hereinbelow, each cutting apparatus is preferably oriented such that its upper portion (described below) faces panel 12. This is not meant to limit the invention, however, as other orientations for the respective cutting apparatus are well within the scope of the present invention.

Figure 2:
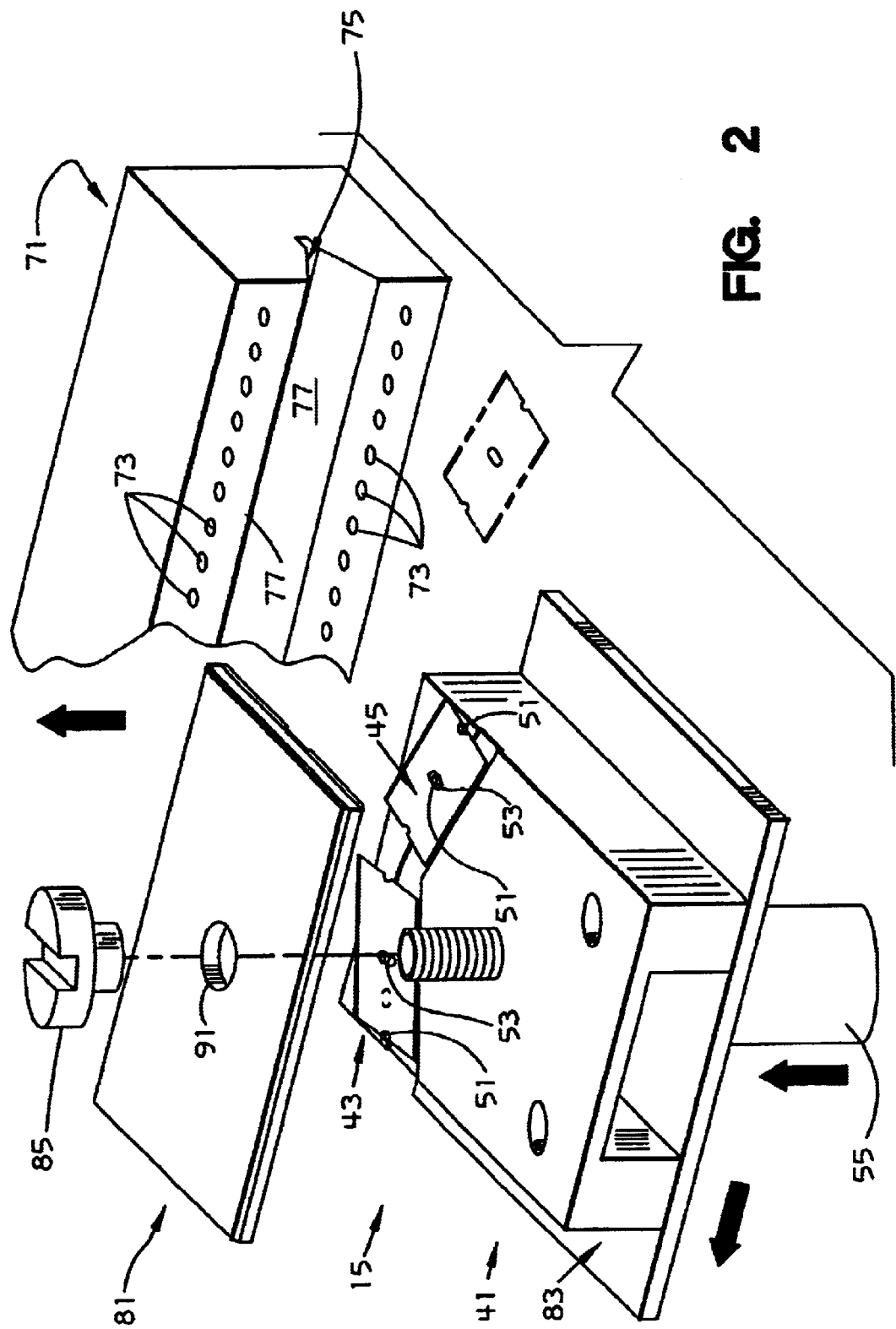
FIG. 2 is an enlarged, perspective view of a cutting apparatus in accordance with a preferred embodiment of the invention.
Figure 3:
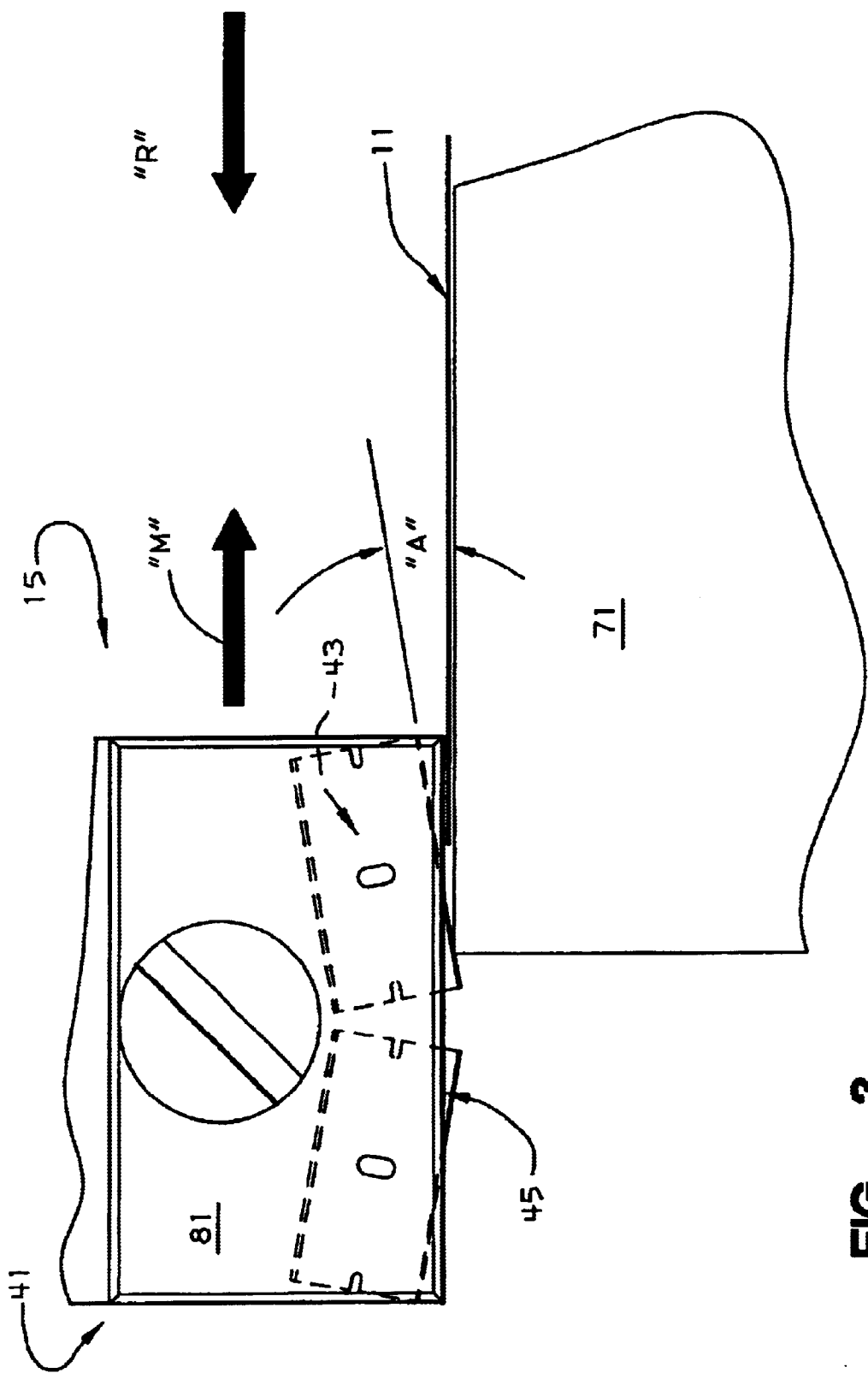
FIG. 3 is a top, plan view, much enlarged, as taken along the line 3—3 in FIG. 1.

In FIGS. 2 and 3, there is shown a cutting apparatus 15 in accordance with one embodiment of the invention. Cutting apparatus 15, as stated, is designed for reciprocally cutting the web material 11 (not shown in FIG. 2) as the web material moves in a first direction (e.g., directly toward the viewer in FIG. 3). Apparatus 15 includes a blade holder 41 designed for having first and second blades 43 and 45 positioned thereon in the angular relationship shown. (One blade is shown in FIG. 2 in phantom for enhanced illustration purposes.) Two blades 43 and 45 are angularly positioned on holder 41 relative to one another and, significantly, also to the direction of movement ("M" in FIG. 3) of the holder as it moves during the cutting operations. As particularly seen in FIG. 3, the first blade 43 forms an acute angle ("A") with respect to the planar film 11, and, significantly, with respect to the direction of movement ("M"). It is thus understood in FIG. 3 that holder 41 moves laterally ("M") to make a first pass wherein the leading blade (43) entirely severs the film 11. That is, first blade 43 is seen to firstly engage a side edge (to the left in FIG. 3) of film material 11 and thereafter cut across the width of said material during such movement ("M") by holder 41. The film continues its movement toward the respective compression roller (21 or 23) and, after a predetermined time period, the holder is moved in the reverse direction ("R" in FIG. 3) whereby the second blade 45 will perform the second cut. Blade 45, like blade 43, also forms an acute angle with film material 11 and also with the corresponding reverse movement ("R") of holder 41. This angle is preferably similar to the angle of blade 43. Blade 45 is thus also understood to initially engage the opposite side edge (to the right in FIG. 3) of film material 11 and thereafter server the material during such reverse movement ("R").

In a preferred embodiment of the invention, angle "A" is preferably within the range of from about ten degrees to about fifteen degrees. Each blade is also preferably metallic and, in one embodiment of the invention, may be of the commercially available double-edged razor blades typically utilized for shaving. Such a feature is deemed particularly significant because it represents a significant cost savings over earlier blade assemblies which, as stated, demanded extensive replacement. The blades of the present invention have proven to function for substantially longer periods of time, even further assuring reduced costs for the present invention. In one example, it was possible to satisfactorily complete 1,000 cuts by each blade through thin film photoresist having an approximate thickness of 0.0015 inch and a width of 23.25 inches.

Positioning of blades 43 and 45 on holder 41 is enhanced through the provision of an internal magnet (not shown) immediately under each of the respective portions of holder 41 designed to accommodate one of the blades. Further retention is attained through the provision of at least two upstanding pins 51 on holder 41 for each blade. The blades preferably include a central opening 53 to accommodate a respective one of these pins 51 in the manner depicted in FIG. 2. Further, each blade preferably includes a side indentation for accommodating the remaining pin of each pair. Thus, a total of four upstanding pins 51 are preferably utilized.

In one embodiment of the invention, holder 41 was comprised of aluminum and was secured to an upstanding post 55 or the like which in turn forms part of system 10. Movement of holder 41 in the various directions illustrated may be accomplished using one of several means, e.g., mechanical means such as cams and cam followers, and further description is not believed necessary. Such movement is, of course, precisely timed with respect to the movement and rate of travel of the corresponding web materials 11.

To further assure a positive severance of the web material at both positions in the manner defined herein, a platen 71 is used to positively engage the opposite surface of web material 11 from that being initially engaged by blades 43 and 45. In one embodiment, platen 71 was comprised of aluminum and included several small apertures 73 located in two aligned rows as shown in FIG. 2. A vacuum force was then exerted through apertures 73 using a suitable vacuum means (not shown). In one embodiment, this vacuum means may comprise a pump directly connected to both platens 71 for drawing air through the respective openings 73. In one embodiment of the invention, a vacuum pressure within the range of from about 4 to about 5 inches Hg was exerted.

To even further assist in film severance, each platen preferably includes a longitudinal groove 75 therein, this groove designed to accommodate both of the blades 43 and 45 during reciprocal movement. Each groove 75 is further defined by a pair of tapered leading edges 77.

The retention of blades 43 and 45 is even further enhanced through the utilization of a cover 81 which, as shown in FIGS. 1 and 3, is adapted for being positioned on what can be referred to as a base 83 of holder 41, e.g., using a retention nut 85 or the like. This nut 85, as shown, positively engages the upper surface of cover 81 which, in one embodiment of the invention, preferably comprised a rectangular, substantially planar metallic plate having a singular opening 91 therein designed for accommodating nut 85. Cover 81 is preferably of the same material as the remaining part (base 83) of holder 41.

The film as cut by the invention is then bonded (lanimated) onto panel 12 and the panel then passed to the next apparatus wherein known photolithographic processing occurs to form a desired circuit pattern on opposite sides of the panel's dielectric. This processing typically involves the steps of exposing (e.g., to UV light) and developing the photoresist to define the pattern, etching away undesired portions of the conductive layer in accordance with this pattern, and thereafter removing (stripping) the photoresist. Such steps are known and further description not believed necessary.

There have thus been shown and described a new and improved cutting apparatus for precisely cutting film material such as dry film photoresist in an accurate manner such that this material may then be bonded to a receiving substrate such as a printed circuit panel 12. Significantly, the invention as defined herein provides for reciprocal, dual cutting of such film material in a reverse manner (perpendicular to the direction of film travel or, in other words, across the film). As taught herein, the bladed structure of the present invention was able to effectively sever dry film photoresist materials having thicknesses from about 0.0006 inch to about 0.003 inch, and having overall width dimensions (e.g., 23 inches) needed for the respective, receiving panels. Effective severing of several sheets was possible using the teachings herein without it being necessary to replace these relatively simple blade members. In one embodiment, the dual bladed cutting apparatus effectively severed a total of 2,000 sheets of dry film material before replacement was considered. Thus, it is seen that the present invention, while being of relatively simple construction, also represents a cost-effective means of providing such cutting.

While there have been shown and described what are at present the preferred embodiments of the invention, it will be obvious to those skilled in the art that various changes and modifications may be made therein without departing from the scope of the invention as defined by the appended claims.

What is claimed is:

1. A method for reciprocally cutting a photoresist film web material movable in a direction of motion, said method comprising the steps of:

cutting said photoresist film web material at a first location by initially engaging a side edge of said web material with a first blade fixedly positioned on a holder adapted for moving in first and second opposite directions substantially perpendicular to said direction of motion of said web material and thereafter cutting said web material when said holder moves in said first direction substantially perpendicular to said direction of motion of said web material; and thereafter initially engaging another side edge of said web material with a second blade fixedly positioned on said holder co-planar with the first blade and fixedly positioned on said holder and thereafter cutting said web material at a second location spaced from said first location when said holder moves in said second opposite direction substantially perpendicular to said direction of motion of said web material, said cutting resulting in a predetermined length of said web material being provided and occurring while said first and second blades are each positioned at an angle of from about ten degrees to about fifteen degrees relative to said web material.

2. The method of claim 1 further including the step of physically engaging said web material to fixedly retain said photoresist film web material relative to said first and second blades during both of said cuttings thereby.

3. The method of claim 2 wherein said physically engaging of said photoresist film web material is accomplished using vacuum pressure.

* * * * *